United States Patent [19]

Lebby et al.

[11] Patent Number: 5,034,092
[45] Date of Patent: Jul. 23, 1991

[54] PLASMA ETCHING OF SEMICONDUCTOR SUBSTRATES

[75] Inventors: Michael S. Lebby, Chandler; Stephen P. Rogers, Mesa, both of Ariz.

[73] Assignee: Motorola, Inc., Schaumburg, Ill.

[21] Appl. No.: 594,790

[22] Filed: Oct. 9, 1990

[51] Int. Cl.⁵ ............................................. H01L 21/00
[52] U.S. Cl. ................................. 156/646; 156/643; 156/662
[58] Field of Search ........................ 156/643, 646, 662

[56] References Cited

U.S. PATENT DOCUMENTS

| | | |
|---|---|---|
| 4,592,800 | 6/1986 | Landau et al. ................... 156/643 |
| 4,855,160 | 8/1989 | Luttmer et al. .................... 437/235 |
| 4,873,176 | 10/1989 | Fisher ................................ 156/643 |

FOREIGN PATENT DOCUMENTS

| | | |
|---|---|---|
| 61-166131 | 12/1986 | Japan . |
| 63-278338 | 5/1987 | Japan . |
| 63-76437 | 4/1988 | Japan . |
| 63-48827 | 7/1988 | Japan . |
| 63-69988 | 8/1988 | Japan . |

Primary Examiner—Richard Bueker
Assistant Examiner—George Goudreau
Attorney, Agent, or Firm—Joe E. Barbee

[57] ABSTRACT

A method for plasma etching semiconductor materials using silicon tetrachloride and boron trichloride is provided. Less etch damage, a greater degree of anisotropy and a more controlled etch is provided by exposing a III-V compound semiconductor to the novel gas mixture.

20 Claims, 1 Drawing Sheet

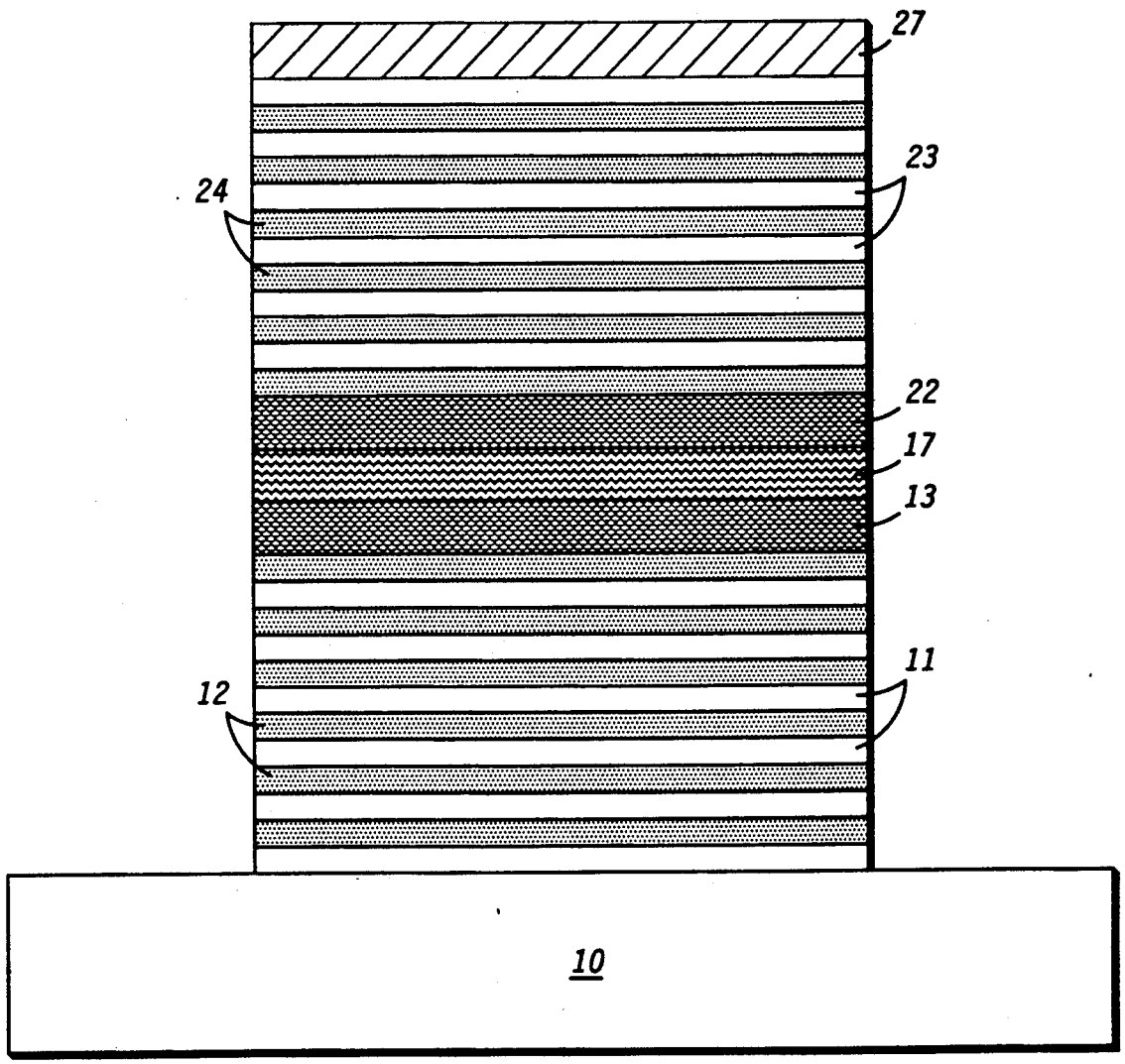

PLASMA ETCHING OF SEMICONDUCTOR SUBSTRATES

BACKGROUND OF THE INVENTION

This invention relates, in general, to etching semiconductor materials, and more specifically to etching vertical cavity surface emitting lasers.

Conventional edge emitting semiconductor lasers are playing a significant role in development of optical communications due to their high operating efficiency, small size and modulation capabilities. However, with increasing performance needs, further reduction in size, and greater manufacturing needs, these devices have been experiencing limitations.

Recently, there has been an increased interest in a new type of laser device called a vertical cavity surface emitting laser (VCSEL). Advantages of VCSEL devices are that the device is smaller, has potentially higher performance, and is potentially more manufacturable. These advantages are due in part from advances in epitaxial deposition techniques such as metal organic vapor phase epitaxy (MOVPE) and molecular beam epitaxy (MBE). However, even with advances in material deposition, problems still occur with performance due to etching of epitaxially deposited materials.

Conventional etching of these materials is achieved in customized plasma reactors with chlorine gas chemistries. Etching with customized reactors and chlorine gas chemistries have yielded devices that have poor performance due to several reasons such as surface damage, poor anisotropy, unstable etch conditions, or the like. Many of these problems are discussed in a paper by A. Scherer, et al, "Fabrication of Microlasers and Microresonator Optical Switches," Applied Physics Letters, December 1989, pages 2724-2726.

It can be seen that use of conventional etching techniques do not meet requirements that are necessary to manufacture sensitive semiconductor devices such as VCSEL's. Therefore, a method for etching sensitive devices by use of common plasma reactors, that would improve etching characteristics and performance of these sensitive devices would be highly desirable.

SUMMARY OF THE INVENTION

The objects and advantages of the present invention are provided by an improved method for etching a semiconductor substrate. The semiconductor substrate is placed into a plasma reactor and exposed to a plasma made of at least boron trichloride and silicon tetrachloride. The semiconductor substrate is then etched with less damage to the semiconductor substrate which enhances performance.

BRIEF DESCRIPTION OF THE DRAWING

A single FIG. illustrates an example of an enlarged simplified cross-section of a VCSEL device prepared on a semiconductor substrate.

DETAILED DESCRIPTION OF THE DRAWINGS

Illustrated in the single drawing is an example of simplified enlarged cross-section of a VCSEL device. It should be understood that this is just a representation of one VCSEL structure and there can be many of these structures located on substrate 10 to form arrays. It should be further understood that other applications could be used for this invention such as etching of trenches or the like.

Substrate 10, in this example, is made of n-doped gallium arsenide. Gallium arsenide is used as substrate to facilitate epitaxial growth of multiple layers of gallium arsenide 11 and aluminum arsenide 12. It should be understood that other semiconductor substrates could be used as well.

Epitaxial deposition of multiple alternate layers of different compositions is accomplished by well known techniques in the art such as MBE, MOCVD, or the like. These techniques enable epitaxial deposition of relatively thin and thick layers of a variety of materials such as gallium arsenide, aluminum gallium arsenide, aluminium arsenide, silicon or the like. Fabrication of VCSEL devices use epitaxial deposition extensively to produce the multitude of layers of different materials which make up the device.

By way of example, epitaxial deposition of alternating layers or films of silicon doped gallium arsenide 11 and aluminum arsenide 12 are deposited on substrate 10. Deposition of alternating layers of doped gallium arsenide 11 and aluminum arsenide 12 form a first set of reflectors or mirrors for the VCSEL device. Thickness of alternating layers of gallium arsenide 11 and aluminum arsenide 12 are set at approximately one quarter wavelength of the frequency that the device is designed to operate at. Nominal thicknesses for gallium arsenide layer 11 and aluminum arsenide layer 12 are 665 angstroms and 800 angstroms, respectively. Generally, efficiency of a VCSEL is increased by increasing the number of alternating layers in the reflector regions.

Cladding region 13 is epitaxially deposited on multiple layers of gallium arsenide 11 and aluminum arsenide 12. Cladding region 13 typically has two parts which are not shown to avoid overcrowding of the FIG. First, a silicon doped aluminum gallium arsenide layer, which is approximately 800 angstroms thick, is deposited on the first reflector. Second, an undoped aluminum gallium arsenide layer, which is approximately 500 angstroms thick, is deposited on the silicon doped aluminum gallium arsenide layer.

Active region 17 is epitaxially deposited on cladding region 13. Active region 17 is commonly made of two barrier regions (not shown) which are deposited on either side of a center strained quantum well region. The two barrier regions are made of approximately 100 angstroms each of undoped gallium arsenide. The strained quantum well region is generally made of undoped indium gallium arsenide with an approximate thickness of 80 angstroms.

A second cladding region 22 is epitaxially deposited on active region 17. Cladding region 22 is commonly made of two parts (not shown). First, approximately 500 angstroms of undoped aluminum gallium arsenide is deposited on active region 17. Second, approximately 800 angstroms of beryllium doped aluminum gallium arsenide is deposited on the undoped aluminum gallium arsenide.

A second reflector or mirror region is epitaxially deposited on second cladding region 22. The second reflector region is composed of alternating layers of beryllium doped gallium arsenide 23 and aluminum arsenide 24. Generally, thickness of the last alternating layer is approximately one half wave length instead of one quarter wave length as is used for the other alternating layers.

Typically, metal layer 27 is made of titanium, platinum, gold, and nickel. Metal layer 27 is fabricated so that geometric patterns are formed by using a common liftoff process. It should be understood that other masking structures and methods could be used to fabricate geometric patterns such as photoresist, dielectrics or the like. Metal layer 27 once patterned serves as an etch mask for etching the exposed alternating layers.

After epitaxially depositing a multitude of layers on substrate 10, the VCSEL structure is defined with masking layer 27, and is etched by exposing unprotected surfaces to a plasma. After the etching is complete, a VCSEL structure illustrated in the single FIG. is obtained. It can be seen that a highly anisotropic dry etch is needed to etch the mesa shaped structure which is typically seven microns high and can have diameters down to one micrometer across the top.

Substrate 10 with protected and unprotected surfaces is placed into a plasma reactor. It should be understood that several different types of reactors are suitable such as reactive ion etch (RIE) systems, magnetron etch systems or the like. A preferred method to etch this structure however, is in a reactive ion etch system.

Silicon tetrachloride ($SiCl_4$) and boron trichloride ($BCl_3$) gases are used to generate a plasma that etches exposed surfaces on substrate 10. Silicon tetrachloride gas is injected into the plasma reactor so that a range between 20 percent and 90 percent by volume is maintained. It is preferred however that a 50 percent by volume of silicon tetrachloride gas be maintained. Boron trichloride gas is also injected into the plasma reactor so that a range between 10 percent and 90 percent by volume is maintained. It is preferred however that a 50 percent by volume of boron trichloride gas be maintained. It should be understood that a nonreactive gas such as nitrogen, argon, or the like can be injected into the plasma to balance the gas mixture. Pressure of the plasma in the reactor is kept in a range of 5 millitorr to 40 millitorr. It is preferred however that the pressure be maintained at 10 millitorr. Power is kept in a range of between 0.5 watts per centimeter squared and 5.0 watts per centimeter squared. Power is preferred to be kept at 1.5 watts per centimeter squared.

It has been known for a long time that plasma generated from chlorine gas is very reactive. This reactivity has deleterious effects on semiconductor devices if not controlled. By using $BCl_3$ and $SiCl_4$, as a novel gas system, several advantages occur without the deleterious effects caused by chlorine gas chemistries.

First, a slower more controllable etch rate is produced by use of this novel gas system. It is believed that a slower etch rate is caused by having a competing reaction between deposition and etching. These competing reactions slow the overall etch rate down to a controllable level.

Second, a more anisotropic etch is produced by use of this novel gas etch chemistry. It is known that chlorine gas plasmas are likely to produce isotropic etching due to their high reactivity. By using this novel etch chemistry isotropic etching is avoided. This benefit is also caused by the competing reaction of deposition and etching, as well as, side-wall protection caused by deposition of silicon and/or boron compounds on the side-walls, which is caused by the new gas etch chemistry itself.

Third, etch damage is reduced by using this novel etch chemistry. Damage of substrates can be caused by a large number of mechanisms which result in crystal dislocations, ion implantation, or the like. By using this novel etch chemistry these damages are reduced. It is believed that damage to side-walls is reduced because of side-wall deposition of a veil or thin film which is occurring during the etching process. This thin film is believed to contain a component of silicon and/or boron compounds, and is not detrimental to the performance of the device.

By now it should be appreciated that there has been provided an improved method for plasma etching semiconductor substrates, and III-V semiconductor substrates. This method allows for the etching of these materials with greater control, a higher degree of anisotropy, and with less damage to the semiconductor device. This method is particularly useful to dry etch gallium arsenide, aluminum arsenide, and indium gallium arsenide using a nickel/gold/platinum/titanium mask resulting in minimal side-wall damage, which is extremely critical in a VCSEL device.

We claim:

1. A method for etching a semiconductor substrate comprising:
   placing the semiconductor substrate in a plasma reactor; and
   exposing the semiconductor substrate to a plasma consisting essentially of boron trichloride and silicon tetrachloride.

2. A method for etching a semiconductor III-V compound substrate comprising:
   placing the semiconductor III-V compound substrate in a plasma reactor;
   exposing the semiconductor III-V compound substrate to a plasma of at least boron trichloride and silicon tetrachloride; and
   etching multiple layers of III-V compound materials.

3. The method of claim 2 further including etching multiple layers of gallium arsenide, aluminum arsenide, and indium gallium arsenide.

4. A method for etching a semiconductor III-V compound substrate comprising:
   placing the semiconductor III-V compound substrate to a plasma reactor;
   exposing the semiconductor III-V compound substrate to a plasma of at least boron trichloride and silicon tetrachloride; and
   etching the semiconductor III-V compound substrate in a reactive ion etch system.

5. The method of claim 4 further including maintaining pressure in the plasma reactor in a range of 5 millitorr to 40 millitorr.

6. The method of claim 5 further including adjusting the pressure to substantially 10 millitorr.

7. The method of claim 4 further including maintaining a power density on the semiconductor substrate in a range of 0.5 watts per centimeter squared to 5 watts per centimeter squared.

8. The method of claim 7 further including adjusting the power density to substantially 1.5 watts per centimeter squared.

9. The method of claim 4 further including maintaining a percent by volume of gases comprising 20 to 90 percent of silicon tetrachloride and 10 to 90 percent of boron trichloride.

10. The method of claim 9 further including using a nonreactive gas for balancing the gases.

11. The method of claim 9 further including adjusting percent volume of silicon tetrachloride substantially to 50 percent and boron trichloride substantially to 50 percent.

12. A method for etching VCSEL lasers comprising the following steps:
   defining a masking layer; and
   exposing the defined area to a gaseous plasma comprising boron trichloride and silicon tetrachloride.

13. The method of claim 12 further including using a metal masking structure.

14. The method of claim 12 further including using a dielectric masking structure.

15. The method of claim 12 further including using a polymeric photoresist masking structure.

16. A method for improving VCSEL performance comprising:
   etching the VCSEL laser by a gaseous plasma comprising boron trichloride and silicon tetrachloride.

17. A method for providing improved performance of a surface emitting laser by creating less damage comprising the steps of:
   defining the surface emitting laser by a masking structure; and
   etching the structure by exposing it to a plasma comprising boron trichloride and silicon tetrachloride.

18. A method for anisotropically etching vertical cavity surface emitting laser comprising:
   defining the surface emitting laser by a masking structure; and
   etching the structure by exposing it to a plasma comprising boron trichloride and silicon tetrachloride.

19. The method of claim 18 wherein the anisotropy is improved by depositing a side-wall film.

20. The method of claim 1 further including using a nonreactive gas injected into the plasma for balancing gases used in the plasma.

* * * * *